United States Patent
Dan (10) Patent No.: US 7,515,005 B2
(45) Date of Patent: Apr. 7, 2009

(54) VARIABLE FREQUENCY MULTI-PHASE OSCILLATOR

(75) Inventor: Claudius Dan, Bucharest (RO)

(73) Assignee: O2Micro International Ltd., Georgetown (KY)

( * ) Notice: Subject to any disclaimer, the term of this patent is extended or adjusted under 35 U.S.C. 154(b) by 111 days.

(21) Appl. No.: 11/583,281

(22) Filed: Oct. 19, 2006

(65) Prior Publication Data

US 2008/0012652 A1    Jan. 17, 2008

Related U.S. Application Data

(60) Provisional application No. 60/818,055, filed on Jun. 30, 2006.

(51) Int. Cl.
*H03K 3/03* (2006.01)
*H03K 3/02* (2006.01)
*H03B 27/00* (2006.01)

(52) U.S. Cl. .................. 331/57; 331/143; 331/150; 331/45; 331/177 R (58) Field of Classification Search .................. 331/45, 331/57, 111, 143, 150, 153, 177 R
See application file for complete search history.

(56) References Cited

U.S. PATENT DOCUMENTS

| 5,903,521 A | * | 5/1999 | Relph .................. 368/113 |
| 6,690,241 B2 | * | 2/2004 | Ooishi et al. .......... 331/57 |
| 2002/0135338 A1 | * | 9/2002 | Hobrecht et al. ...... 323/272 |
| 2006/0226921 A1 | * | 10/2006 | Hsu ...................... 331/57 |

OTHER PUBLICATIONS

Palm, "Treo 650 datasheet", accessed from http://www.palm.com/us/support/handbooks/treo/treo650_GSM_DS.pdf on Apr. 1, 2008.*
Palm, "Historical Timeline", accessed from http://www.palm.com/us/company/corporate/timeline.html on Apr. 1, 2008.*

* cited by examiner

*Primary Examiner*—Robert Pascal
*Assistant Examiner*—Ryan J. Johnson
(74) *Attorney, Agent, or Firm*—Wang Law Firm; Li K. Wang (57) ABSTRACT

A variable frequency multi-phase oscillator for providing multi-phase signals is disclosed. The variable frequency multi-phase oscillator includes a correlator, a plurality of delay cells, and a NOR circuit. Each delay cell includes a current supply, a capacitor, a comparator, a switch, and a logic unit. The plurality of delay cells generate the multi-phase signals that are phase correlated within a large frequency range. The frequency and duty cycles of the multi-phase signals are adjustable.

24 Claims, 8 Drawing Sheets

VARIABLE FREQUENCY MULTI-PHASE OSCILLATOR

RELATED APPLICATION

This application claims the benefit of U.S. provisional application, titled Multi-phase Oscillator, Ser. No. 60/818,055, filed on Jun. 30, 2006, the specification of which is incorporated herein in its entirety by this reference.

BACKGROUND OF THE INVENTION

1. Field of the Invention

The present invention relates to power management and in particular to multi-phase oscillators used for power management.

2. Description of the Related Art

Currently, variable frequency multi-phase oscillators are becoming more and more common in today's society as the capabilities and use of such oscillators continue to expand. The variable frequency multi-phase oscillators can be widely used in various power management units. When used in the PMUs, the variable frequency multi-phase oscillators can generate complex clock signals to drive other components. In other words, the variable frequency multi-phase oscillators can supply multiple phase (multi-phase) signals to multiple components, for example, DC/DC converters. In usage, it is necessary for the variable frequency multi-phase oscillators to supply multi-phase signals to synchronize the multiple components that are connected to the variable frequency multi-phase oscillators. The oscillators usually employ one of, or any combination of, internal inductors, resistors, capacitors and other necessary elements to determine its frequency.

For example, in the application of the PMUs, the variable frequency multi-phase oscillators are required to be tunable, i.e., their output frequency is a function of a control input, usually a voltage. For example, a voltage-controlled oscillator is a circuit whose output frequency is a function of its input control voltage. The output frequency of a variable frequency multi-phase oscillator can be further affected by the inherent delay time of some internal components.

Usually, portable electronic devices heavily rely on smart power management units (PMUs) to provide different power supply voltages from a single power supply (i.e., power source) that usually is a battery. Each DC/DC converter channel as mentioned above may have an uneven current that increases during the first time interval of each cycle of the phase signal ($T_{ON}$) while decreases or even drops to zero during the second time interval of each cycle of the phase signal ($T_{OFF}$). In order to improve supply current distribution, each DC/DC conversion cycle should start at a different moment. Hence, a multi-phase oscillator is needed. In order to accommodate a large range of applications, the PMUs should be able to operate at different frequencies thus imposing the usage of variable frequency multi-phase oscillators.

To achieve above-mentioned synchronization, various measures should be taken to adjust the multi-phase signals to obtain desirable phase correlation according to different requirements. Hence, the DC/DC converters can operate out of phase in order to reduce noises, relax input filtering condition, and avoid unwanted inrush input current.

The conventional solution used to generate the multi-phase signals is to employ a master frequency clock whose frequency should be N times higher (i.e., much higher) than the particular synchronized clock frequency. This imposes a very high frequency master clock in order to achieve small duty cycles for low frequency signals. Using a high frequency oscillator implies high power consumption and difficult frequency adjustment. This also leads to complicated phase adjustment, virtually impossible individual duty cycle design, and un-scalable circuit design.

It is thus desirous to have an apparatus and method that provides a variable frequency multi-phase oscillator having multi-phase outputs embedded in an integrated circuit with simple duty cycle control, large frequency range, simple frequency adjustment configuration and low power dissipation and at the same time without adding to the complexity of the integrated circuit. It is to such apparatus and method the present invention is primarily directed.

BRIEF SUMMARY OF THE INVENTION

In one embodiment, there is disclosed a variable frequency multi-phase oscillator for generating multi-phase signals. The variable frequency multi-phase oscillator includes a correlator, a plurality of delay cells, and a NOR circuit. The correlator receives a control signal from an external source and generates a threshold voltage. The plurality of delay cells are coupled in series with each other. Each delay cell receives the control signal from the external source and the threshold voltage from the correlator and generates one multi-phase signal. The NOR circuit receives a plurality of multi-phase signals from the plurality of delay cells and generates an output signal to one of the plurality of delay cells.

In yet another embodiment, there is disclosed a variable frequency multi-phase oscillator for generating multi-phase signals. The variable frequency multi-phase oscillator includes a control unit, a plurality of correlators, a plurality of delay cells, and a NOR circuit. The control unit receives an input signal from an external source and generates a plurality of control signals. The plurality of correlators receives the plurality of control signals from the control unit and generates a plurality of threshold voltages. The plurality of delay cells are coupled in series with each other. Each delay cell is coupled in parallel with one of the plurality of correlators, receives one of the plurality of control signals from the control unit and one of the plurality of threshold voltage, and generates one of the multi-phase signals. The NOR circuit receives the multi-phase signals from the plurality of delay cells and generates an output signal to one of the plurality of delay cells.

In yet another embodiment, there is disclosed a method for generating multi-phase signals. The method includes the steps of (a) receiving a current control signal, (b) generating a threshold voltage at each delay cell according to the current control signal, (c) generating the multi-phase signals based upon the current control signal and the threshold voltage at each delay cell, (d) computing the multi-phase signals at a NOR circuit, (e) generating a digital signal at the NOR circuit, and (f) repeating steps (c)-(e) if the digital signal is high.

In yet another embodiment, there is disclosed an apparatus. The apparatus includes a PMU and a plurality of DC/DC converters. The PMU includes a variable frequency multi-phase oscillator and a plurality of controllers. The variable frequency multi-phase oscillator includes a correlator, a plurality of delay cells, and a NOR circuit. The correlator receives a control signal from a source and generates a threshold voltage. The plurality of delay cells is coupled in serials with each other. Each delay cell receives the control signal from the source and the threshold voltage from the correlator and generates one of the multi-phase signals. The NOR circuit receives the multi-phase signals from the plurality of delay cells and generates an output signal to one of the plurality of delay cells. Each controller receives one of the multi-phase signals. Each DC/DC converter is controlled by one of the plurality of controllers.

In yet another embodiment, there is disclosed a wireless communication device capable of communicating with a base station through a wireless communication network. The wireless communication device includes a controller, a transceiver, a user interface, a storage unit, and a power unit. The transceiver communicates with the base station through antenna under control of the controller. The user interface is capable of receiving audio and video data from users and displaying the audio and video data to the users. The storage unit is capable of storing the audio and video data. The power unit supplies power to the controller, the transceiver, the user interface and the storage unit. The power unit includes a variable frequency multi-phase oscillator. The variable frequency multi-phase oscillator includes a correlator, a plurality of delay cells, and a NOR circuit. The correlator is capable of receiving a control signal from a source and generating a threshold voltage. The plurality of delay cells is coupled in series with each other. Each delay cell is capable of receiving the control signal from the source and the threshold voltage from the correlator and generating one of the multi-phase signals. The NOR circuit is capable of receiving the multi-phase signals from the plurality of delay cells and generating an output signal to one of the plurality of delay cells.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Figure 1:
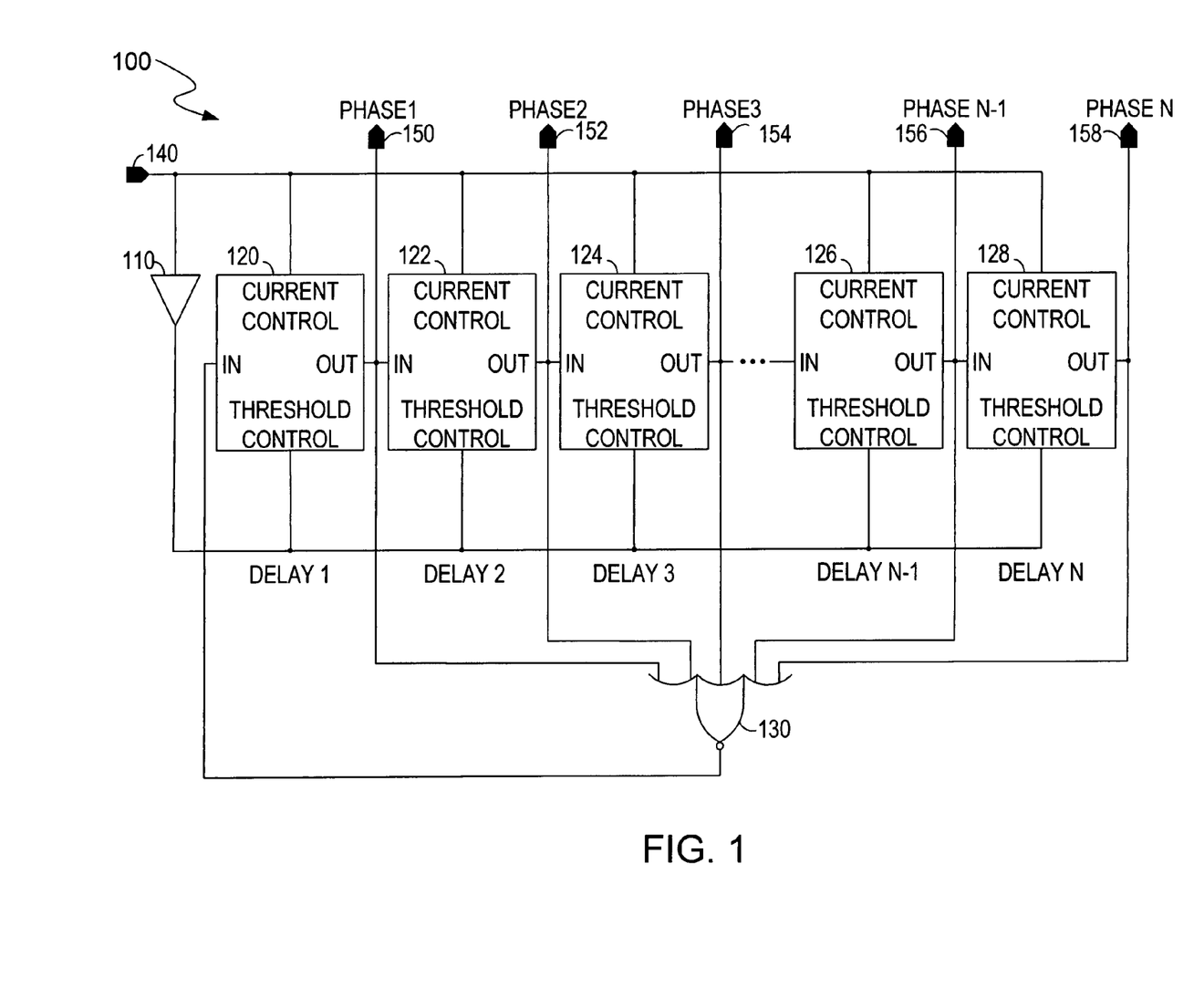
FIG. 1 is a block diagram of an exemplary variable frequency multi-phase oscillator with constant duty cycles consistent with the invention.

The present invention provides a variable frequency multi-phase oscillator whose multi-phase outputs are phase correlated. FIG. 1 illustrates a block diagram of an exemplary variable frequency multi-phase oscillator 100 with constant duty cycles. The variable frequency multi-phase oscillator 100 is a variable frequency oscillator. In this embodiment, the variable frequency multi-phase oscillator 100 is mainly composed of a current-threshold correlator 110, a plurality of delay cells 120, 122, 124, 126, and 128, and a NOR circuit 130. Since this embodiment shown in FIG. 1 is only for illustrative purposes, some sub-components and/or peripheral components generally incorporated in the variable frequency multi-phase oscillator 100 are omitted herein for clarity. In addition, the number of the delay cells can be changed to any number (no less than two) depending on the requirements of certain applications.

The variable frequency multi-phase oscillator 100 includes an input port 140 and a plurality of output ports 150, 152, 154, 156, and 158. The input port 140 can receive an input signal, for example, an analog signal from an external element (not shown). The analog signal can be a current signal, a voltage signal or their combination. The frequency of the analog signal is much lower than that of the variable frequency multi-phase oscillator 100. The analog signal is supplied to the current-threshold correlator 110 and the plurality of delay cells 120, 122, 124, 126, and 128 to control the oscillating frequency of the variable frequency multi-phase oscillator 100. The oscillating frequency of the variable frequency multi-phase oscillator 100 is also determined by the total number of the above-mentioned delay cells.

The current-threshold correlator 110 can receive the analog signal and generate a threshold voltage. The threshold voltage is then delivered to the plurality of delay cells 120, 122, 124, 126, and 128. Controlled by the analog signal and the threshold voltage, the plurality of delay cells 120, 122, 124, 126, and 128 produce multi-phase signals.

The delay cell 120 has a current control terminal, a threshold control terminal, an input terminal, and an output terminal. The plurality of delay cells 120, 122, 124, 126, and 128 are current-controlled delay cells and form a structure of a ring oscillator. The output terminal of the delay cell 120 is coupled to the input terminal of the delay cell 122. Similarly, the output terminal of the delay cell 122 is coupled to the input terminal of the delay cell 124. Likely, the output terminal of the delay cell 126 is coupled to the input terminal of the delay cell 128. Consequently, the plurality of delay cells 120, 122, 124, 126, and 128 are cascaded.

The delay cell 120 receives the analog signal at the current control terminal and the threshold voltage at the threshold control terminal. The delay cell 120 also receives an output signal of the NOR circuit 130 at its input terminal. Under control of the analog signal and the threshold voltage, the delay cell 120 generates a phase signal (i.e., a clock signal) at the output terminal 150. In addition, the duty cycle of the phase signal can vary when the analog signal and/or the internal parameters of the current-threshold correlator 110 and the delay cell 120 changes. The oscillating frequency of the variable frequency multi-phase oscillator 100 is also changeable through adjustment of the analog signal, the internal parameters of the current-threshold correlator 100, and/or the internal parameters of the plurality of delay cells 120, 122, 124, 126, and 128. In operation, when the phase signal (clock signal) at the output terminal 150 drops to low, the phase signal at the output terminal 152 will become high, and so on up to the delay cell 128 that will be described in details below.

In this embodiment, the analog signal from the input port 140 can be a current to control frequency and duty cycle of the multi-phase signals generated by the variable frequency multi-phase oscillator 100. The current can also be used to charge a capacitor included in the delay cell 120. The time necessary to charge the capacitor is defined as the delay of the delay cell 120. The delay cell 120 has an internal comparator that can compare its input signals. Such comparison will result in an inherent delay of the comparator. In order to compensate the inherent delay of the comparator and maintain a desirable relationship between the current and the delay of the delay cell 120, the threshold voltage generated by the current-threshold correlator 110 can be automatically adjusted as described in details below.

In FIG. 1, other delay cells 122, 124, 126, and 128 have the same configuration as the delay cell 120, and therefore repetitive descriptions on the similar points, for example, functions are omitted herein for more clarity.

In this embodiment, the NOR circuit 130 is a NOR gate. The NOR gate 130 can receive a plurality of phase signals, i.e., multi-phase signals from the plurality of delay cells 120, 122, 124, 126, and 128. These multi-phase signals are NORed by the NOR gate 130. The phase signals (clock signals) provided by the above-mentioned delay cells are sequentially activated one by one. Until all of the timings of the phase signals drop to zero, a new cycle will be initiated.

Figure 2:
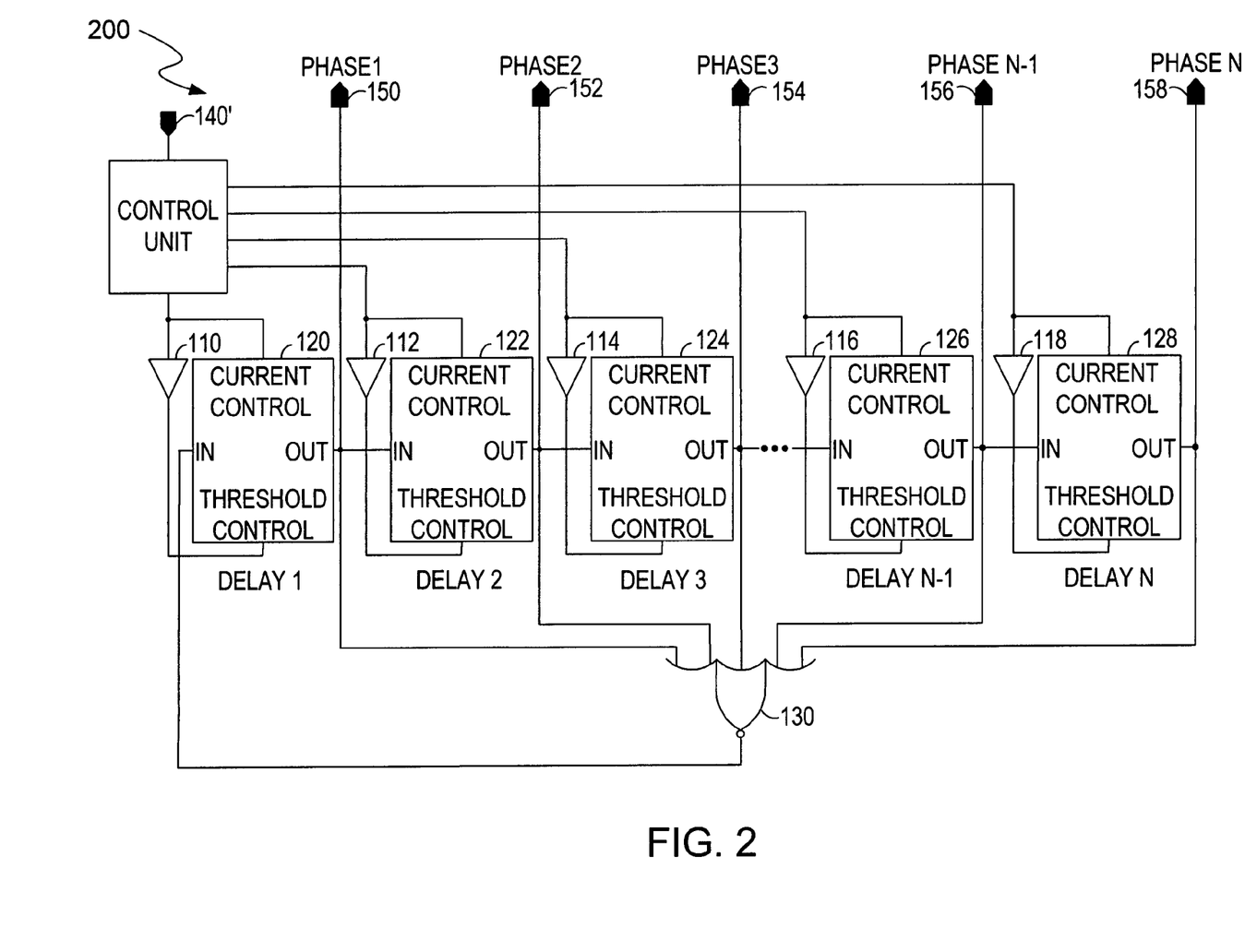
FIG. 2 is a block diagram of another exemplary variable frequency multi-phase oscillator with variable duty cycles consistent with the invention.

FIG. 2 is a block diagram of another exemplary variable frequency multi-phase oscillator 200 with variable duty cycles. The variable frequency multi-phase oscillator 200 is mainly composed of a control unit 210, a plurality of current-threshold correlators 110, 112, 114, 116, and 118, the plurality of delay cells 120, 122, 124, 126, and 128, and the NOR circuit 130. Since the plurality of current-threshold correlators 112, 114, 116, 118 have the same configuration as the current-threshold correlator 110 in FIG. 1, the repetitive description of their similar functions will be omitted herein for clarity. Similarly, the repetitive description of other similar configuration and function of the variable frequency multi-phase oscillator 200 will also be omitted herein for more clarity. Only the difference between the variable frequency multi-phase oscillators 200 and 100 will be depicted in detail below.

The control unit 210 receives a signal, for example, an analog signal from an external element (not shown in FIG. 2). The analog signal can be a current signal, a voltage, or their combination. The control unit 210 can convert this analog signal into a plurality of control signals that can be further delivered to the plurality of current-threshold correlators 110, 112, 112, 116, and 118 and the plurality of delay cells 120, 122, 124, 126, and 128. In this embodiment, the control unit 210 can be any circuit topology that can implement the function of signal conversion. The control unit 210 may be implemented in a variety of configurations with different components, which will not be described in detail herein. The control unit 210 converts the analog signal to a current signal in this embodiment. Those skilled in the art will appreciate that the voltage signal or the combination of the current signal and the voltage signal can also be used to control the current-threshold correctors and their associated delay cells. In this situation, some circuit topology will be employed in the variable frequency multi-phase oscillator 200, which will not be described herein for clarity.

The frequencies of the plurality of control signals are much lower than that of the variable frequency multi-phase oscillator 200. The analog signal is used to control the oscillating frequency of the variable frequency multi-phase oscillator 200. Additionally, the oscillating frequency of the variable frequency multi-phase oscillator 200 is also determined by the total number of the above-mentioned delay cells.

In FIG. 2, each delay cell is coupled to one current-threshold correlator. For example, the delay cell 120 is equipped with the current-threshold correlator 110. Similarly, the delay cell 128 is connected to the current-threshold correlator 118. As described above, the variance of the internal parameter of the current-threshold correlator 110 can affect the duty cycle of the phase signal generated by the delay cell 120. The control signal received by the delay cell 120 can also control the duty cycle of the phase signal at the output terminal 150. Hence, the duty cycle of each phase signal is controlled by the control signal and the threshold voltage received by the corresponding delay cell. Consequently, the configuration of multiple current-threshold correlators can enable the variable frequency multi-phase oscillator 200 to generate the multi-phase signals having different duty cycles, wherein the duty cycle of each phase signal individually is constant. The variance of the duty cycle of the multi-phase signals depends on the adjustment of the threshold voltage and the control signals, which will be described in great detail below. The oscillating frequency of the variable frequency multi-phase oscillator 200 is also changeable through adjustment of the analog signal, the internal parameters of the current-threshold correlator 100, and/or the internal parameters of the plurality of delay cells 120, 122, 124, 126, and 128. In a specific condition, the oscillating frequency of the variable frequency multi-phase oscillator 200 can be constant.

Figure 3:
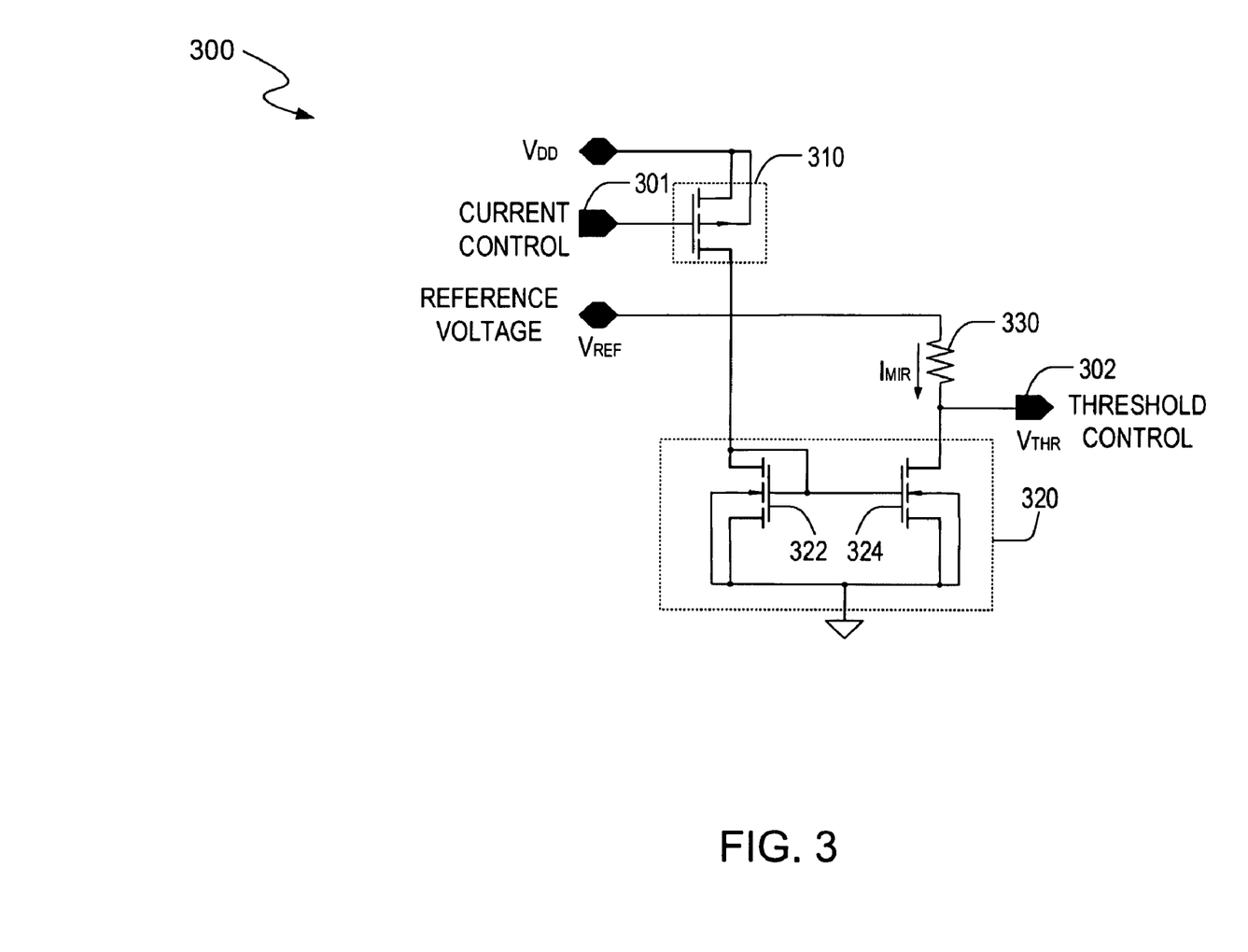
FIG. 3 is a schematic diagram of one current-threshold correlator of the oscillators in FIGS. 1 and 2.

FIG. 3 illustrates a schematic diagram of one embodiment 300 of one current-threshold correlator of the oscillators in FIGS. 1 and 2. In this embodiment, the current-threshold correlator 300 is composed of a current generator 310, a current mirror 320, and a resistor 330. The current-threshold correlator 300 has a current control port 301 and a threshold control port 302. The current control port 301 is the input port of the current-threshold correlator 300 and the threshold control port 302 is the output port of the current-threshold correlator 300. In the variable frequency multi-phase oscillator 100, the current control port 301 receives the analog signal from the external element (not shown in FIG. 1). In the variable frequency multi-phase oscillator 200 shown in FIG. 2, the current control port 301 receives one of the plurality of control signals that is also an analog signal from the control unit 210.

In this embodiment, the current generator 310 can be a P-channel MOS (PMOS) transistor. The PMOS 310 receives the above analog signal, converts it to a current, and then sends the current to the current mirror 320. The current mirror 320 is formed by NMOS transistors 322 and 324. The current mirror 320 generates a mirrored current $I_{MIR}$ flowing through the resistor 330. The resistor 330 is supplied a reference voltage $V_{REF}$ that is generated by an internal element (not shown in FIG. 3). The current-threshold correlator 300 will output a threshold voltage $V_{THR}$ at the threshold port 302 as given by equation (1).

$$V_{THR} = V_{REF} - I_{MIR} * R \qquad (1)$$

Wherein $V_{THR}$ is the threshold voltage at the threshold control port 302, $V_{REF}$ is the reference voltage, $I_{MIR}$ is the mirrored current generated by the current mirror 320, and R is the resistance of the resistor 330.

The threshold voltage depends on the analog signal and the parameters of the current generator 310, the current mirror 320, and the resistor 330. The threshold voltage can vary with the variance of the analog signal and the parameters of elements included in the current-threshold correlator 300. In other words, the threshold voltage can be adjusted through adjustment of the analog signal and the parameters of the elements included in the current-threshold correlator 300 in different ways to satisfy diverse requirements of the multi-phase signals.

Figure 4:
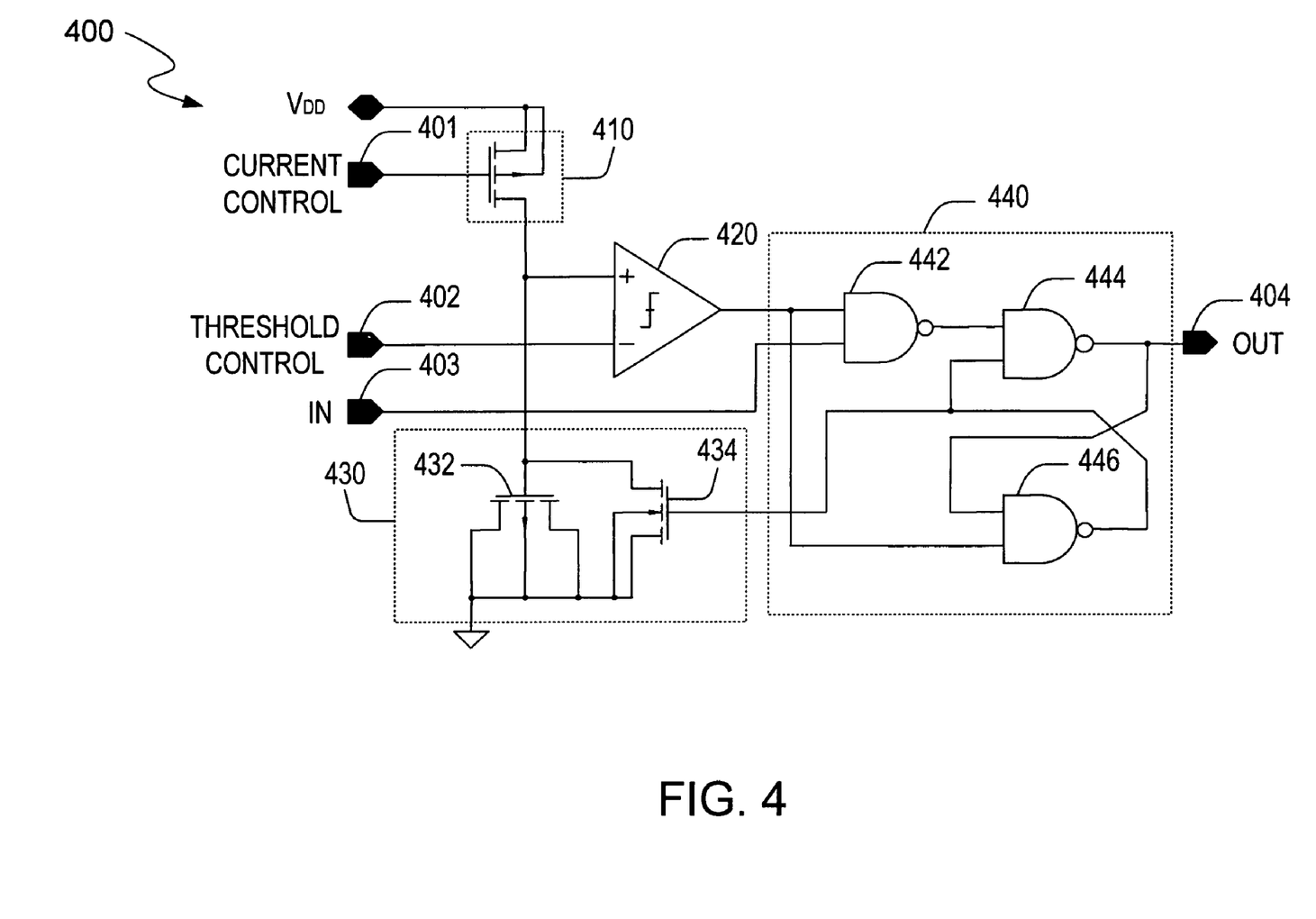
FIG. 4 is a schematic diagram of one delay cell of the oscillators in FIGS. 1 and 2.

FIG. 4 illustrates a schematic diagram of one embodiment 400 of one delay cell of the oscillators in FIGS. 1 and 2. The delay cell 400 is composed of a current source 410, a comparator 420, a charging and discharging circuit 430, and an RS flip-flop 440. The delay cell 400 includes a current control port 401, a threshold control port 402, an input port 403, and an output port 404. The current control port 401 can receive the analog signal from the external element in the variable frequency multi-phase oscillator 100 or one of the plurality of control signals from the control unit 210 that is also an analog signal in the variable frequency multi-phase oscillator 200.

In this embodiment, the current source 410 can be a PMOS transistor. Similar to the PMOS transistor 310, the PMOS transistor 410 in FIG. 4 receives the above analog signal and converts it to a current.

The charging and discharging circuit 430 is composed of a PMOS transistor 432 and an NMOS transistor 434. The PMOS transistor 432 is coupled in parallel with the NMOS transistor 434. The PMOS transistor 432 acts as a capacitor whose charging time is defined as the delay of the delay cell 400. The NMOS transistor 434 serves as a control switch. The PMOS transistor 432 (the capacitor 432) can be charged by the current (i.e., the charging current) from the PMOS transistor 410 during a certain period when the NMOS transistor 434 (the switch 434) is turned off. The PMOS transistor 432 can be discharged when the NMOS transistor 434 is tuned on. Hence, a saw-tooth signal will be generated by the charging and discharging circuit 430.

The comparator 420 has a non-inverting input terminal and an inverting input terminal. The non-inverting input terminal of the comparator 420 is coupled to the drain terminal of the PMOS transistor 410 and the gate terminal of the PMOS transistor 432. The non-inverting input terminal of the comparator 420 receives the saw-tooth signal while the inverting input terminal receives a threshold voltage at the threshold control port 402 from a current-threshold correlator, for example, the current-threshold correlator 300.

The comparator 420 can generate a digital signal after comparison of the saw-tooth signal and the threshold voltage. When the saw-tooth signal is higher than the threshold voltage, the comparator 420 will generate logic 1. Conversely, when the saw-tooth signal is lower than the threshold voltage, the comparator 420 will generate logic 0.

The RS flip-flop 440 is composed of NAND gates 442, 444, and 446. The RS flip-flop 440 receives the digital signal from the comparator 420 and an input signal at the input port 403 and produces a phase signal at the output port 404. The RS flop-flop 440 also produces a control signal to control the NMOS transistor 434. When the gate terminal of the NMOS transistor 434 is controlled by logic 0, i.e., the NAND gate 446 outputs logic 0, the NMOS transistor 434 is turned off. In this situation, the PMOS transistor 432 is charged by the charging current from the PMOS transistor 410. When the PMOS transistor 432 is charged to a level larger than the threshold voltage, the comparator 420 will produce logic 1. In this condition, the NAND gate 442 generates logic 1 when the input signal at the input port 403 is logic 0, and the NAND gate 444 produces logic 1.

In opposite, when the NAND gate 446 outputs logic 1, the NMOS transistor 434 will be turned on. Hence, the PMOS transistor 432 is discharged to zero. When the saw-tooth signal is smaller than the threshold voltage, the comparator 420 will generate logic 0. After receiving the logic 0, the RS flip-flop 440 will produce logic 0 at the output port 404.

The internal configuration of the comparator 420 can result in an inherent delay. In order to compensate the delay of the comparator 420, the threshold voltage at the threshold control port 402 can be correspondingly adjusted to maintain a desirable relationship between the current and the delay. This adjustment is implemented by changing the analog signal at the current control port 401 and the parameters of the elements included in the current-threshold correlator 300 in FIG. 3. As a result of this compensation technique, the multi-phase signals will have desirable related phase.

As described before, the current used to charge the capacitor 432 (the charging current) and the threshold voltage of the comparator 420 depend on the above-mentioned analog signal. Thus, the frequency of the analog signal can affect the charging current and the threshold voltage of the comparator 420. In other words, the frequency of the analog signal can modify the charging current and the threshold voltage. Hence, the saw-tooth signal with certain constant amplitude is obtained at the non-inverting terminal of the comparator 420.

Figure 5:
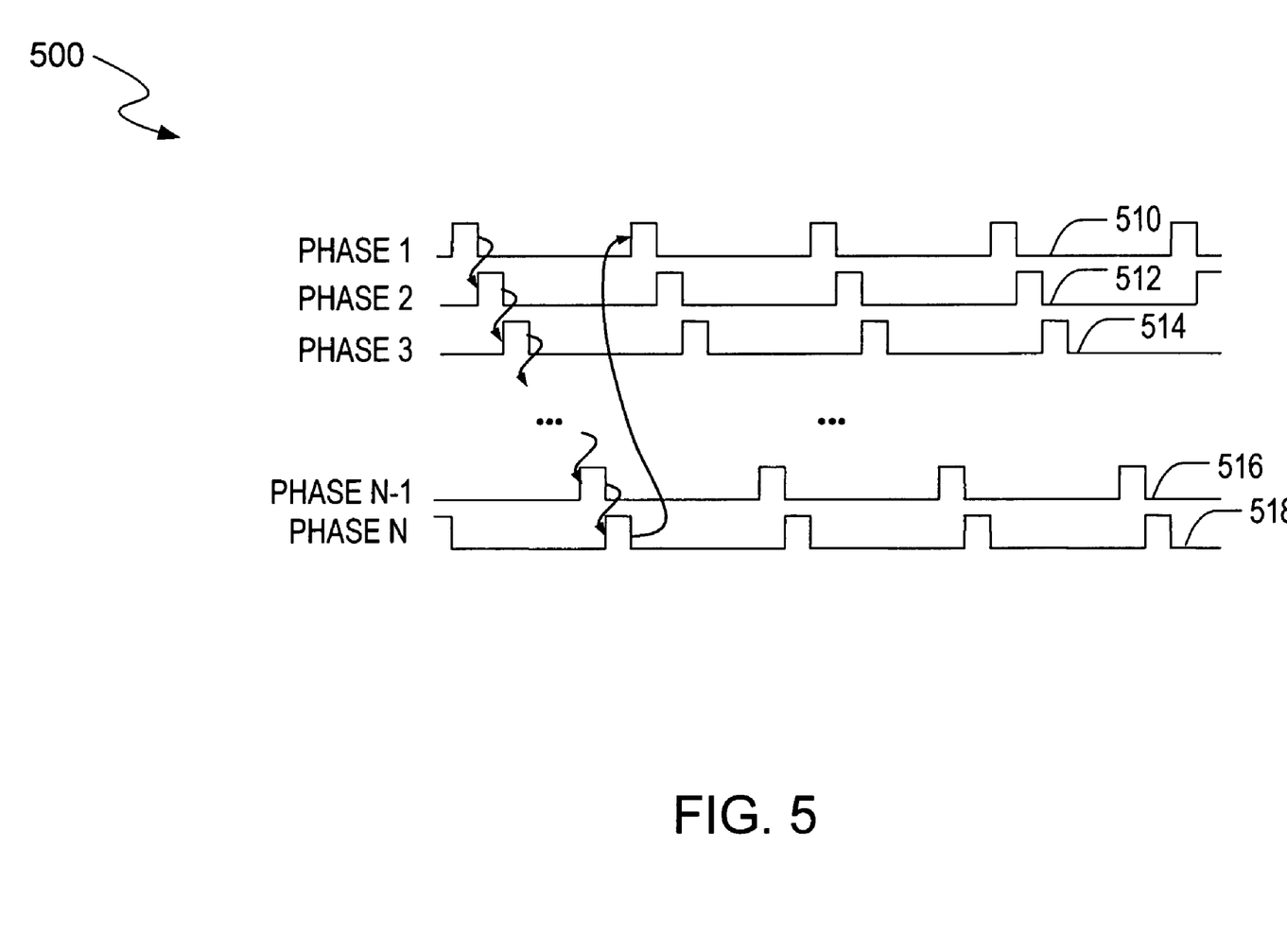
FIG. 5 is a phase waveform of the variable frequency multi-phase oscillator in FIG. 1.

FIG. 5 is a phase waveform 500 of the variable frequency multi-phase oscillator 100 in FIG. 1. The phase waveform 500 illustrates the phase signals at the output terminals of the delay cells 120, 122, 124, 126, and 128. Plot 510, 512, 514, 516, and 518 are the phase signals at the output terminals 150, 152, 154, 156, and 168, respectively. The duration when the phase signals are high is a time-slot. The phase signals have the same time-slot for all of the above-mentioned delay cells whose time-shifted pulses have same variable frequency and fixed duty cycles. When the phase signal 510 drops to low, the phase signal 512 will become high, and so up to the timing of the phase signal 518. A new cycle will start until all of the phase signals drop to zero.

Figure 6:
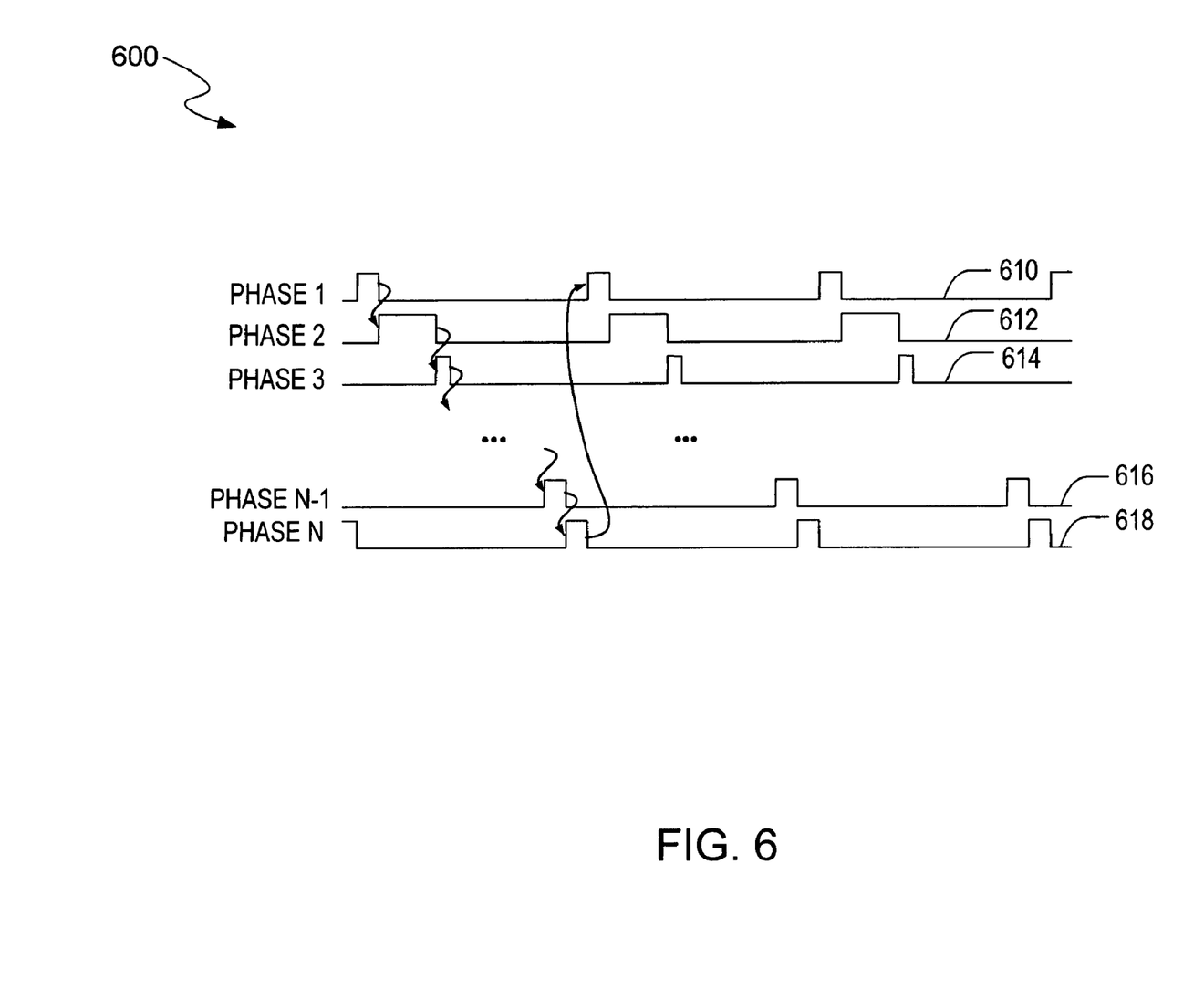
FIG. 6 is a phase waveform of the variable frequency multi-phase oscillator in FIG. 2.

FIG. 6 is a phase waveform 600 of the variable frequency multi-phase oscillator 200 in FIG. 2. The phase waveform 600 depicts the phase signals at the output terminals of the delay cells 120, 122, 124, 126, and 128. Plot 610, 612, 614, 616, and 618 are the phase signals at the output terminals 150, 152, 154, 156, and 158, respectively. The phase signals have uneven time-slots for all the of aforementioned delay cells whose time-shifted pulses have individually fixed duty cycles. The frequency of the phase signals can be variable or constant that depends on the different parameters of the elements included in the variable frequency multi-phase oscillator 200. When the timing of the phase signal 610 elapses, the timing of the phase signal 612 will start, and so up to the timing of the phase signal 618. A new cycle will start until all of the timings of the phase signals drop to zero.

Figure 7:
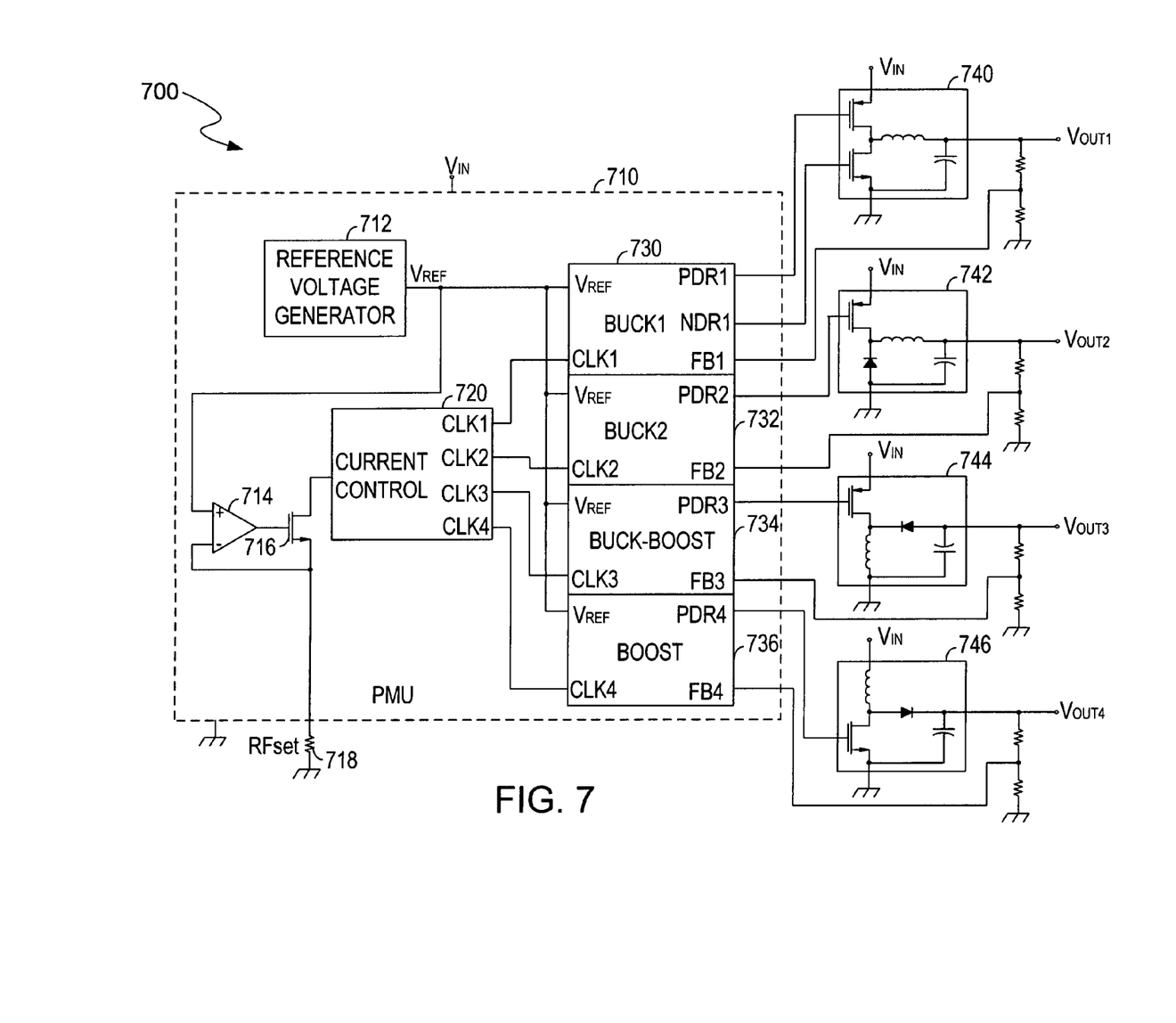
FIG. 7 is a block diagram of an application system including a variable frequency multi-phase oscillator.

Turning to FIG. 7, an application system 700 is illustrated. The application system 700 includes a PMU 710, a resistor 718, and a plurality of DC/DC converters 740, 742, 744, and 746. The PMU 710 is capable of driving different types of DC/DC converters, such as buck, boost or buck-boost converters.

The PMU 710 includes a reference voltage generator 712, a comparator 714, a PMOS transistor 716, a variable frequency multi-phase oscillator 720, and a plurality of controllers 730, 732, 734, and 736. The reference voltage generator 712 is used to generate a reference voltage. The comparator 714, the PMOS transistor 716, and the resistor 718 can convert the reference voltage to a current. The variable frequency multi-phase oscillator 720 is controlled by the current from the PMOS transistor 716 and generates a plurality of multi-phase signals (clock signals) to the plurality of controllers 730, 732, 734, and 736. Each controller receives one of the clock signals and controls one of the plurality of DC/DC converters. Hence, the clock signals can be used to drive and synchronize the DC/DC converters. In this embodiment, the controllers 740 and 742 are buck converters, the controller 744 is a buck-boost converter, and the controller 746 is a boost converter. The plurality of DC/DC converters can provide desirable DC output signals to drive external elements. Those skilled in the art will appreciate that the type of the DC/DC converters in FIG. 7 are only for illustrative purpose, and other types of DC/DC converters can also be used. The variable frequency multi-phase oscillators 700 can be implemented by the aforementioned configuration whose description will be omitted herein for clarity.

Figure 8:
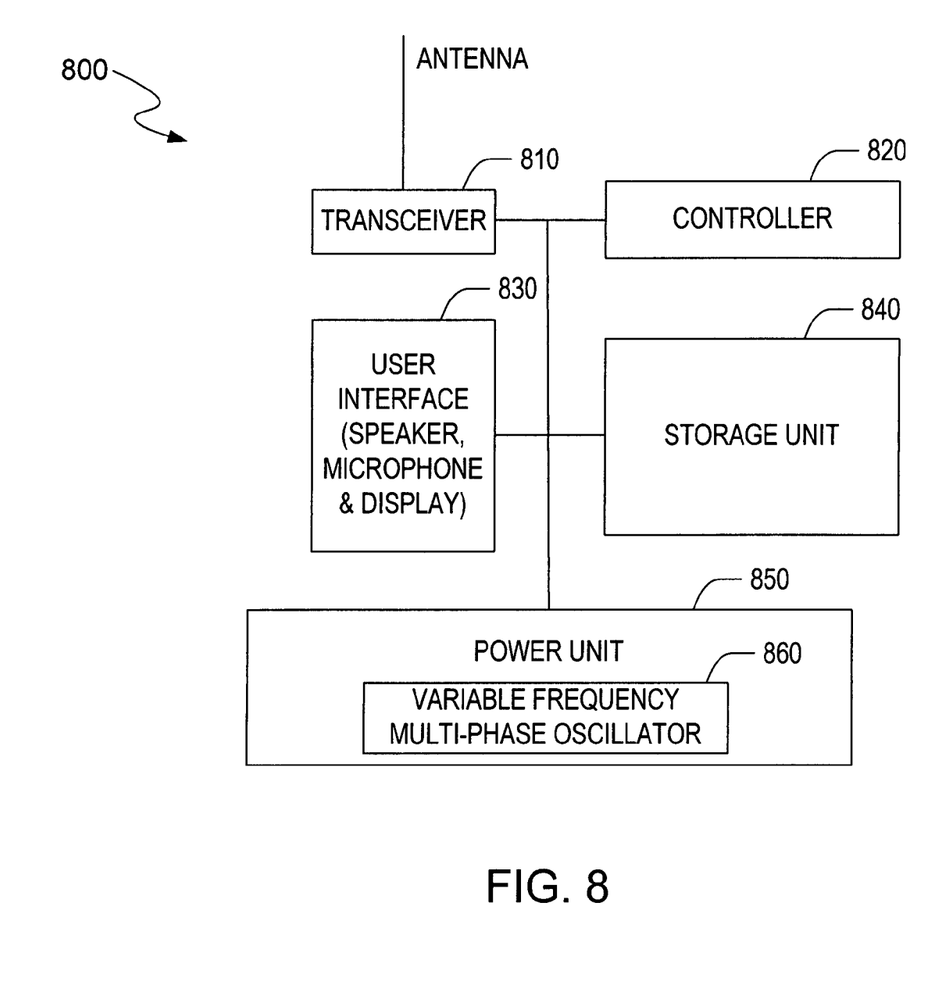
FIG. 8 is a block diagram of a cell phone with a power unit equipped with a variable frequency multi-phase oscillator.

FIG. 8 illustrates a cell phone 800 with a power unit equipped with a variable frequency multi-phase oscillator.

The cell phone 800 mainly includes a transceiver 810, a controller 820, a user interface 830, a storage unit 840, and a power unit 850. The transceiver 810 can communicate with a base station via wireless communication, for example, receives/sends audio and video data from a wireless network through the antenna. Controlled by the controller 820, the data reflecting the wireless signals can be stored in the storage unit 840. The user interface 830 controls speaker, microphone and display unit that enable the users to receive and send audio and video data. The power unit 850 powers the cell phone 800 and further includes a variable frequency multi-phase oscillator 860. The variable frequency multi-phase oscillator 860 can be implemented by the abovementioned technologies and configurations. The variable frequency multi-phase oscillator 860 can generate desirable phase signals according to the requirement of the cell phone 800. The architecture presented in FIG. 8 may also be applied to other wireless communication devices such as a personal digital assistant equipped with wireless communication components.

In operation, the variable frequency multi-phase oscillator 100 can receive the analog signal and generate the multi-phase signals (phase-correlated clock signals) within a large frequency range to synchronize external DC/DC converters. Many key parameters including the current and/or voltage provided by the analog signal and the parameters of the necessary elements included in the variable frequency multi-phase oscillator 100 are important for regulating of the duty cycles of the multi-phase signals and the oscillating frequency of the variable frequency multi-phase oscillator 100. In other words, any variance of the above parameters can affect the function of the variable frequency multi-phase oscillator 100. The elements in the variable frequency multi-phase oscillator 100 may include the current-threshold correlator 110 and the plurality of delay cells 120, 122, 124, 126, and 128, and the NOR gate 130.

As an alternative, the elements to form the variable frequency multi-phase oscillator 200 may include the control unit 210, the plurality of current-threshold correlators 110, 112, 114, 116, and 118, and the plurality of delay cells 120, 122, 124, 126, and 128, and the NOR gate 130. Hence, the above-mentioned key parameters can includes the plurality of control signals generated by the control unit 210 based upon the analog signal and the parameters of the above-mentioned current-threshold correlators and delay cells included in the variable frequency multi-phase oscillator 200.

The embodiment 300 is taken as an example to illustrate the function of one current-threshold correlator. The current-threshold correlator 300 can produce the threshold voltage. The adjustment of the threshold voltage is implemented through adjusting the analog signal, the parameters of the PMOS transistor 310, the current mirror 320, the resistor 330, and the reference voltage.

The embodiment 400 is only for illustrative purpose to depict one delay cell. In the delay cell 400, the PMOS transistor 410 converts the analog signal or one of the control signals to a charging current that can be utilized to charge the capacitor 432 when the switch 434 is switched off. The capacitor 432 is discharged when the switch 434 is switched on. The charging and discharging of the capacitor 432 can result in a saw-tooth signal that is sent to the comparator 420. After comparing the saw-tooth signal and the threshold voltage, the comparator 420 can generate a digital signal to control the RS flip-flop 440. Controlled by the digital signal and an input signal at the input port 403, the RS flip-flop 440 produces a phase signal.

In the variable frequency multi-phase oscillator 100, the current-threshold correlator 110 can generate the threshold voltage to simultaneously control the plurality of delay cells 120, 122, 124, 126, and 128. Therefore, the multi-phase signals have the equal duty cycles. However, in the variable frequency multi-phase oscillator 200, each delay cell is controlled by one of the plurality of the control signals and the associated current-threshold correlator. Hence, the duty cycles of the phase signals generated by the variable frequency multi-phase oscillator 200 can be uneven when the plurality of control signals are different.

The embodiments that have been described herein, however, are but some of the several which utilize this invention and are set forth here by way of illustration but not of limitation. It is obvious that many other embodiments, which will be readily apparent to those skilled in the art, may be made without departing materially from the spirit and scope of the invention as defined in the appended claims. Furthermore, although elements of the invention may be described or claimed in the singular, the plural is contemplated unless limitation to the singular is explicitly stated.

What is claimed is:

1. A variable frequency multi-phase oscillator for generating multi-phase signals, comprising:
   a correlator for receiving a control signal from an external source and generating a threshold voltage;
   a plurality of delay cells coupled in series with each other, each delay cell having an output port, each delay cell receiving the control signal from the external source and the threshold voltage from the correlator and generating one multi-phase signal; and
   a NOR circuit for receiving a plurality of multi-phase signals from the plurality of delay cells and generating an output signal to one of the plurality of delay cells, the NOR circuit being coupled to the output port of each delay cell, wherein each delay cell further comprising
   a current supply for providing a charging current,
   a capacitor coupled to the current supply,
   a comparator coupled to the current supply and the capacitor, the comparator generating a digital signal,
   a switch coupled in parallel with the capacitor, and
   a logic unit having a first input terminal, a second input terminal, a first output terminal and a second output terminal, the first input terminal receiving the digital signal from the comparator, the second input terminal acting an input terminal of the delay cell, the first output terminal providing one of multi-phase signals, and the second output terminal providing a control signal to the switch.

2. The variable frequency multi-phase oscillator of claim 1, wherein the correlator further comprising:
   a current supply, the current supply providing a source current;
   a current mirror, the current mirror receiving the source current from the current supply and generating a mirrored current; and
   a resistor coupled to the current mirror, the resistor receiving a reference voltage and the mirrored current and generating the threshold voltage.

3. The variable frequency multi-phase oscillator of claim 1, wherein the switch being turned off when the control signal from the second output terminal of the logic unit is low and the capacitor being charged by the charging current from the current supply when the switch is turned off.

4. The variable frequency multi-phase oscillator of claim 1, wherein the switch being turned on when the control signal from the second output terminal of the logic unit is high.

5. The variable frequency multi-phase oscillator of claim 1, wherein the logic unit being an RS flip-flop.

6. A variable frequency multi-phase oscillator for generating multi-phase signals, comprising:
a control unit for receiving an input signal from an external source and generating a plurality of control signals;
a plurality of correlators for receiving the plurality of control signals from the control unit and generating a plurality of threshold voltages;
a plurality of delay cells coupled in series with each other, each delay cell having an output port, each delay cell being coupled in parallel with one of the plurality of correlators, receiving one of the plurality of control signals from the control unit and one of the plurality of threshold voltage, and generating one of the multi-phase signals; and
a NOR circuit coupled to the output port of each delay cell, the NOR circuit receiving the multi-phase signals from the plurality of delay cells and generating an output signal to one of the plurality of delay cells and generating an output signal to one of the plurality of delay cells, wherein each delay cell further comprising
a current supply for providing a charging current,
a capacitor coupled to the current supply,
a comparator coupled to the current supply and the capacitor, the comparator generating a digital signal,
a switch coupled in parallel with the capacitor, and
a logic unit having a first input terminal, a second input terminals, a first output terminal and a second output terminal, the first input terminal receiving the digital signal from the comparator, the second input terminal acting an input terminal of the delay cell, the first output terminal providing one of multi-phase signals, and the second output terminal providing a control signal to the switch.

7. The variable frequency multi-phase oscillator of claim 6, wherein each correlator further comprising:
a current supply, the current supply providing a source current;
a current mirror, the current mirror receiving the source current from the current supply and generating a mirrored current; and
a resistor coupled to the current mirror, the resistor receiving a reference voltage and the mirrored current and generating one of the plurality of threshold voltages.

8. The variable frequency multi-phase oscillator of claim 6, wherein the switch being turned off when the control signal from the second output terminal of the logic unit is low and the capacitor being charged by the charging current from the current supply when the switch is turned off.

9. The variable frequency multi-phase oscillator of claim 6, wherein the switch being turned on when the control signal from the second output terminal of the logic unit is high.

10. The variable frequency multi-phase oscillator of claim 6, wherein the logic unit being an RS flip-flop.

11. A method for generating multi-phase signals, comprising the steps of:
(a) receiving a current control signal;
(b) generating a threshold voltage at a correlator according to the current control signal;
(c) generating the multi-phase signals based upon the current control signal and the threshold voltage at a plurality of delay cells;
(d) computing the multi-phase signals from all of said plurality of delay cells at a NOR circuit;
(e) generating a digital signal at the NOR circuit; and
(f) repeating steps (c) to (e) if the digital signal is high, wherein the step (c) further comprising
generating a voltage signal at a capacitor,
comparing the voltage signal and the threshold voltage,
generating a digital signal according to comparison between the voltage signal and the threshold voltage,
obtaining the digital signal and an input signal at an RS flip-flop, and
generating a switch control signal and one of the multi-phase signals under control of the digital signal and the input signal.

12. The method of claim 11, wherein the step of (b) comprising:
generating a source current based upon the current control signal from the external source;
generating a mirrored current at a current mirror based upon the source current;
receiving a reference voltage from an external element; and
generating the threshold voltage based upon the reference voltage and the mirrored current.

13. The method of claim 11, wherein the step of generating the voltage signal further comprising:
generating a charge current based upon the current control signal;
turning off the switch when the switch control signal is low;
charging a capacitor by the charging current when the switch is turned off to updating the voltage signal at the capacitor;
turning on a switch when the switch control signal is high; and
discharging the capacitor when the switch is turned off to updating the voltage signal at the capacitor.

14. The method of claim 11, wherein the step of (e) comprising:
generating logic 0 when one of the multi-phase is high; and
generating logic 1 when all of the multi-phase signals are low.

15. An apparatus, comprising:
a variable frequency multi-phase oscillator for providing multi-phase signals, the variable frequency multi-phase oscillator including:
a correlator, the correlator receiving a control signal from a source and generating a threshold voltage;
a plurality of delay cells coupled in series with each other, each delay cell having an output port, each delay cell receiving the control signal from the source and the threshold voltage from the correlator and generating one of the multi-phase signals;
a NOR circuit coupled to the output port of each delay cell, the NOR circuit receiving the multi-phase signals from the plurality of delay cells and generating an output signal to one of the plurality of delay cells; and
a plurality of controllers, each controller receiving one of the multi-phase signals; and
a plurality of DC/DC converters, each DC/DC converter being controlled by one of the plurality of controllers, wherein each delay cell further comprising
a current supply for providing a charging current,
a capacitor coupled to the current supply,
a comparator coupled to the current supply and the capacitor, the comparator generating a digital signal,
a switch coupled in parallel with the capacitor, and
a logic unit having a first input terminal, a second input terminal, a first output terminal and a second output terminal, the first input terminal receiving the digital signal from the comparator, the second input terminal acting an input terminal of the delay cell, the first output terminal providing one of multi-phase signals, and the second output terminal providing a control signal to the switch.

16. The apparatus of claim 15, wherein the correlator further comprising:
   a current supply, the current supply providing a source current;
   a current mirror, the current mirror receiving the source current from the current supply and generating a mirrored current; and
   a resistor coupled to the current mirror, the resistor receiving a reference voltage and the mirrored current and generating the threshold voltage.

17. The apparatus of claim 15, wherein the switch being turned off when the control signal from the second output terminal of the logic unit is low and the capacitor being charged by the charging current from the current supply when the switch is turned off.

18. The apparatus of claim 15, wherein the switch being turned on when the control signal from the second output terminal of the logic unit is high.

19. The apparatus of claim 15, wherein the logic unit being an RS flip-flop.

20. A wireless communication device capable of communicating with a base station through a wireless communication network, comprising:
   a controller;
   a transceiver communicating with the base station through antenna under control of the controller;
   a user interface capable of receiving audio and video data from users and displaying the audio and video data to a user;
   a storage unit capable of storing the audio and video data; and
   a power unit supplying power to the controller, the transceiver, the user interface and the storage unit, the power unit including a variable frequency multi-phase oscillator, the variable frequency multi-phase oscillator comprising:
      a correlator capable of receiving a control signal from a source and generating a threshold voltage;
      a plurality of delay cells coupled in series with each other, each delay cell having an output port, each delay cell capable of receiving the control signal from the source and the threshold voltage from the correlator and generating one of the multi-phase signals; and
      a NOR circuit capable of receiving the multi-phase signals from the plurality of delay cells and generating an output signal to one of the plurality of delay cells, the NOR circuit being coupled to the output port of each delay cell, wherein each delay cell further comprising
      a current supply for providing a charging current,
      a capacitor coupled to the current supply,
      a comparator coupled to the current supply and the capacitor, the comparator generating a digital signal,
      a switch coupled in parallel with the capacitor, and
      a logic unit having a first input terminal, a second input terminal, a first output terminal and a second output terminal, the first input terminal receiving the digital signal from the comparator, the second input terminal acting an input terminal of the delay cell, the first output terminal providing one of multi-phase signals, and the second output terminal providing a control signal to the switch.

21. The wireless communication device of claim 20, wherein the correlator further comprising:
   a current supply, the current supply providing a source current;
   a current mirror, the current mirror receiving the source current from the current supply and generating a mirrored current; and
   a resistor coupled to the current mirror, the resistor receiving a reference voltage and the mirrored current and generating the threshold voltage.

22. The wireless communication device of claim 20, wherein the switch being turned off when the control signal from the second output terminal of the logic unit is low and the capacitor being charged by the charging current from the current supply when the switch is turned off.

23. The wireless communication device of claim 20, wherein the switch being turned on when the control signal from the second output terminal of the logic unit is high.

24. The wireless communication device of claim 20, wherein the logic unit being an RS flip-flop.

* * * * *